US008013424B2

(12) United States Patent
Okamoto

(10) Patent No.: US 8,013,424 B2
(45) Date of Patent: Sep. 6, 2011

(54) SEMICONDUCTOR DEVICE AND METHOD OF FABRICATING THE SAME

(75) Inventor: Hiroki Okamoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 364 days.

(21) Appl. No.: 12/194,085

(22) Filed: Aug. 19, 2008

(65) Prior Publication Data

US 2009/0050965 A1 Feb. 26, 2009

(30) Foreign Application Priority Data

Aug. 20, 2007 (JP) ................................ 2007-213567

(51) Int. Cl.
*H01L 29/06* (2006.01)

(52) U.S. Cl. ............ 257/618; 257/55; 257/57; 257/592; 257/E29.056; 257/E29.085; 257/E29.267

(58) Field of Classification Search .................... 257/55, 257/57, 592, 618, E29.056, E21.085, E29.267
See application file for complete search history.

(56) References Cited

U.S. PATENT DOCUMENTS

| | | | | |
|---|---|---|---|---|
| 6,051,509 | A | 4/2000 | Tsuchiaki | |
| 6,271,566 | B1 | 8/2001 | Tsuchiaki | |
| 6,977,400 | B2 | 12/2005 | Puchner et al. | |
| 7,132,338 | B2 | 11/2006 | Samoilov et al. | |
| 7,592,231 | B2 * | 9/2009 | Cheng et al. | 438/300 |
| 2001/0025998 | A1 | 10/2001 | Tsuchiaki | |
| 2005/0266631 | A1 | 12/2005 | Kim et al. | |
| 2006/0131657 | A1 | 6/2006 | Hamaguchi | |
| 2006/0202234 | A1 | 9/2006 | Hara | |
| 2007/0012913 | A1 | 1/2007 | Ohta et al. | |

FOREIGN PATENT DOCUMENTS

| | | |
|---|---|---|
| JP | 5-283685 | 10/1993 |
| JP | 2003-109969 | 4/2003 |
| JP | 2004-48017 | 2/2004 |
| JP | 2006-13428 | 1/2006 |
| JP | 2006-165480 | 6/2006 |

OTHER PUBLICATIONS

Junichi Murota, et al., "Atomically controlled processing for group IV semiconductors", Surface and Interface Analysis, vol. 34, 2002, pp. 423-431.

N. Yasutake, et al., "Scalability of eSiGe technology for 32 nm node and beyond", ISTDM, 2008, 2 pages.

H. Okamoto, et al., "In-situ Doped Embedded-SiGe Source/Drain Technique for 32 nm-node pMOSFET", Extended Abstracts of the 2007 International Conference on Solid State Devices and Materials, 2007, pp. 866-867.

Hiroki Okamoto, et al., "In situ Doped Embedded-SiGe Source/Drain Technique for 32nm Node p-Channel Metal—Oxide—Semiconductor Field-Effect Transistor", Japanese Journal of Applied Physics, vol. 47, No. 4. 2008, pp. 2564-2568.

* cited by examiner

*Primary Examiner* — Long K Tran

(74) *Attorney, Agent, or Firm* — Oblon, Spivak, McClelland, Maier & Neustadt, L.L.P.

(57) ABSTRACT

A semiconductor device according to an embodiment includes: a semiconductor substrate; a gate electrode formed on the semiconductor substrate via a gate insulating film; a channel region formed in a region of the semiconductor substrate below the gate electrode; an epitaxial crystal layer containing a conductive impurity, which is formed sandwiching the channel region and has a function as a source region and a drain region, and formed on a recess in the semiconductor substrate; and a growth suppressing portion formed on the recess in the semiconductor substrate, and configured to suppress an epitaxial growth of a crystal in the epitaxial layer from the semiconductor substrate.

14 Claims, 18 Drawing Sheets

1 SEMICONDUCTOR DEVICE
9a FIRST SILICIDE LAYER
4 GATE ELECTRODE
6 EPITAXIAL CRYSTAL LAYER
5
5 GATE SIDEWALL
9b SECOND SILICIDE LAYER
10 ELEMENT ISOLATION REGION
9b
10
3 GATE INSULATING FILM
8
6
2 SEMICONDUCTOR SUBSTRATE
8 GROWTH SUPPRESSING REGION
7 CHANNEL REGION
Z
X

1 SEMICONDUCTOR DEVICE
9b SECOND SILICIDE LAYER
6 EPITAXIAL CRYSTAL LAYER
5 GATE SIDEWALL
9a FIRST SILICIDE LAYER
4 GATE ELECTRODE
5
6e EXTENSION REGION
6e
9b
10 ELEMENT ISOLATION REGION
2 SEMICONDUCTOR SUBSTRATE
6
8 GROWTH SUPPRESSING REGION
7 CHANNEL REGION
3 GATE INSULATING FILM
8
10
Z
X

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2007-213567, filed on Aug. 20, 2007, the entire contents of which are incorporated herein by reference.

BACKGROUND

There is a method of fabricating a conventional semiconductor device in which a crystal having a lattice constant different from that of a Si crystal of a substrate is embedded in a source/drain region using an epitaxial crystal growth method and to generate a strain in a channel region using difference in lattice constant.

However, for using an embedded epitaxial crystal as a source/drain region, it is necessary to give conductivity to the epitaxial crystal. As a method for giving conductivity to the epitaxial crystal, there are methods to grow an epitaxial crystal containing a conductive impurity with in-situ impurity doping (for example, in a non-patent literary document of J. Murota et al. Surf. Interface Anal. 2002; 34: 423-431), and to implant a conductive impurity to an epitaxial crystal by an ion implantation after growing the epitaxial crystal not containing a conductive impurity (for example, in Japanese Patent KOKAI No. 2006-13428).

BRIEF SUMMARY

A semiconductor device according to one embodiment includes: a semiconductor substrate; a gate electrode formed on the semiconductor substrate via a gate insulating film; a channel region formed in a region of the semiconductor substrate below the gate electrode; an epitaxial crystal layer containing a conductive impurity, which is formed sandwiching the channel region and has a function as a source region and a drain region, and formed on a recess in the semiconductor substrate; and a growth suppressing portion formed on the recess in the semiconductor substrate, and configured to suppress an epitaxial growth of a crystal in the epitaxial layer from the semiconductor substrate.

A method of fabricating a semiconductor device according to another embodiment includes: forming a gate electrode on a semiconductor substrate via a gate insulating film; forming recesses on both sides of the gate electrode in the semiconductor substrate; forming a growth suppressing portion to suppress an epitaxial growth of a crystal in a predetermined region which is at least a portion of region on the bottom surface of the recess; and forming an epitaxial crystal layer containing a conductive impurity in the recess by an epitaxial crystal growth method in which an inner lateral surface of the recess is used as a base.

DETAILED DESCRIPTION

When using a method to grow an epitaxial crystal containing a conductive impurity with in-situ impurity doping so as to give conductivity to an epitaxial crystal which generates a strain in a channel region of a source/drain region, since the crystal grows uniformly from a bottom surface of a region which becomes mainly a source/drain region, an impurity concentration in the crystal in a direction parallel to a surface of a substrate becomes uniform. Therefore, it is not possible to selectively decrease only an impurity concentration in a region adjacent to a gate in the crystal and it is not possible to form the epitaxial crystal sufficiently close to the gate in order to avoid a deterioration of a roll-off characteristic. As a result, a sufficient strain may not be generated in the channel region.

Meanwhile, when using a method to implant a conductive impurity to an epitaxial crystal by an ion implantation procedure after growing the epitaxial crystal not containing a conductive impurity, a lattice defect or the like is generated by a damage to the epitaxial crystal due to the ion implantation, which may possibly reduce the effect of the strain generated in the channel region by the epitaxial crystal.

First Embodiment

Figure 1:
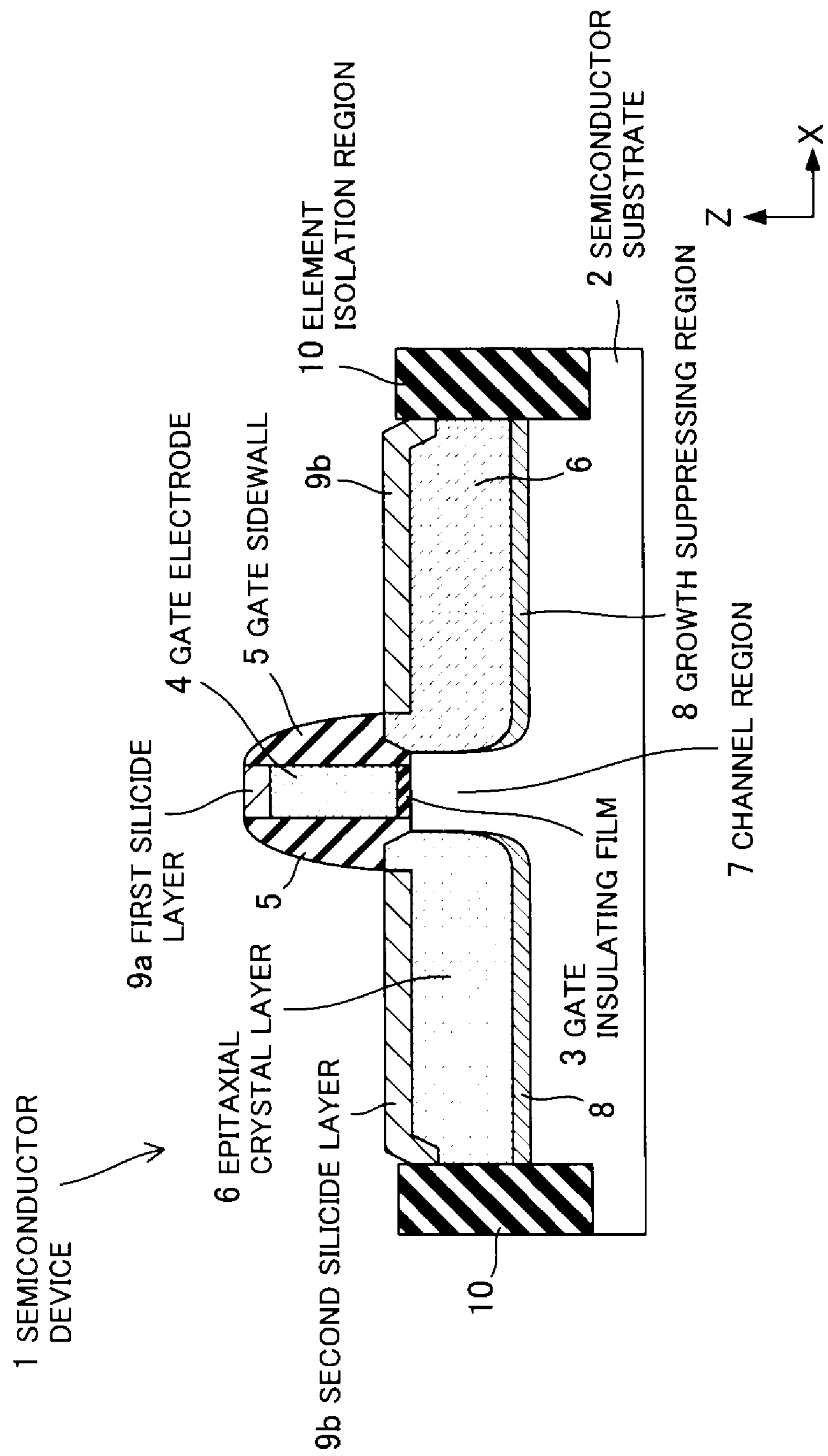
FIG. 1 is a cross sectional view of a semiconductor device according to a first embodiment.

FIG. 1 is a cross sectional view of a semiconductor device according to a first embodiment. A semiconductor device 1 is schematically configured to have a gate electrode 4 formed on a semiconductor substrate 2 via gate insulating film 3, a gate sidewall 5 formed on a side face of the gate electrode 4, a channel region 7 formed under the gate electrode 4 in the semiconductor substrate 2, an epitaxial crystal layer 6 formed sandwiching the channel region 7, a growth suppressing region 8 formed in a region near an interface between a bottom surface of the epitaxial crystal layer 6 and the semiconductor substrate 2 in the semiconductor substrate 2, a first silicide layer 9*a* formed on an upper surface of the gate electrode 4, a second silicide layer 9*b* formed on an upper surface of the epitaxial crystal layer 6 and an element isolation region 10 formed in the semiconductor substrate 2.

For the semiconductor substrate 2, for example, a Si substrate is used.

The gate insulating film 3 is composed of, for example, $SiO_2$, SiN, SiON, or a high-dielectric material (for example, an Hf-based material such as HfSiON, HfSiO or HfO, a Zr-based material such as ZrSiON, ZrSiO or ZrO, and a Y-based material such as $Y_2O_3$).

The gate electrode 4 is composed of, for example, polycrystalline silicon containing a conductive impurity or polycrystalline silicon germanium containing a conductive impurity. As for the conductive impurity, a p-type impurity ion such as B, $BF_2$ or the like is used for a p-type transistor and an n-type impurity ion such as As, P or the like is used for an n-type transistor. Furthermore, the gate electrode 4 may be a metal gate electrode composed of W, Ta, Ti, Hf, Zr, Ru, Pt, Ir, Mo, Al or the like, or a compound thereof, in this case, the first silicide layer 9*a* is not formed on the upper surface of the gate electrode 4.

The first silicide layer 9*a* is composed of, for example, a compound of a metal such as Ni, Pt, Co, Er, Y, Yb, Ti, Pd, NiPt, CoNi or the like, with Si. Note that, although the first silicide layer 9*a* is formed by siliciding an upper portion of the gate electrode 4, a fully silicided gate electrode may be formed by siliciding the whole gate electrode 4.

The gate sidewall 5 may have, for example, a single layer structure comprising SiN, a structure of two layer made of multiple types of insulating material comprising SiN, $SiO_2$, TEOS (Tetraethoxysilane) or the like, furthermore, may have a structure of three or more layers.

The epitaxial crystal layer 6 is composed of a crystal having a lattice constant different from that of a crystal composing the semiconductor substrate 2. For a p-type transistor, the epitaxial crystal layer 6 is formed by epitaxially growing a crystal having a lattice constant larger than that of the crystal composing the semiconductor substrate 2. For example, when the semiconductor substrate 2 is composed of a Si crystal, a SiGe crystal or the like is epitaxially grown. Meanwhile, for an n-type transistor, the epitaxial crystal layer 6 is formed by epitaxially growing a crystal having a lattice constant smaller than that of the crystal composing the semiconductor substrate 2. For example, when the semiconductor substrate 2 is composed of a Si crystal, a SiC crystal or the like is epitaxially grown.

Here, when the epitaxial crystal layer 6 is composed of a crystal having a lattice constant larger than that of the crystal composing the semiconductor substrate 2, it is possible to improve mobility of hole in the channel region 7 by generating a compressive strain in the channel region 7 by the epitaxial crystal layer 6. Meanwhile, when the epitaxial crystal layer 6 is composed of a crystal having a lattice constant smaller than that of the crystal composing the semiconductor substrate 2, it is possible to improve mobility of electron in a channel region 7 by generating a tensile strain in the channel region 7 by the epitaxial crystal layer 6.

Note that, it is preferable that a Ge concentration of a SiGe crystal used for the epitaxial crystal layer 6 is 10-30 At % and a C concentration of a SiC crystal is 3 At % or less. When the Ge concentration of the SiGe crystal is less than 10 At %, a strain generated in the channel region 7 is not sufficient, and when it exceeds 30 At %, a crystal defect is provoked in a substrate or the like, which may cause a leak current. Furthermore, when the C concentration of a SiC crystal exceeds 3 At %, a crystal defect is still provoked in the substrate or the like, which may cause a leak current.

Furthermore, the epitaxial crystal layer 6 contains the conductive impurity and functions as a source/drain region. As for the conductive impurity, a p-type impurity ion such as B, $BF_2$ or the like is used for a p-type transistor and an n-type impurity ion such as As, P or the like is used for an n-type transistor. The concentration distribution of the conductive impurity in the epitaxial crystal layer 6 is uneven and there is a portion in which the concentration increases in accordance with increasing distance from the gate electrode 4 in the concentration distribution of the conductive impurity in a direction parallel to a channel direction. Especially, it is preferable that an average concentration in a region within a predetermined range (for example, unit volume) adjacent to the channel region 7 is preferably lower than an average concentration within another predetermined region (for example, unit volume) distant from the channel region 7. Furthermore, it is especially preferable that the concentration in the region adjacent to the channel region 7 is the lowest. Note that, the term "unevenness" here does not include the level of unevenness which occurs due to an inaccuracy based on fabrication accuracy of a manufacturing equipment of a semiconductor device, operation accuracy of a person who operates the manufacturing equipment and an environment at the time of fabrication.

The growth suppressing region 8 has a function to suppress an epitaxial crystal growth and is formed by implanting an impurity in a region near the interface between the bottom surface of the epitaxial crystal layer 6 and the semiconductor substrate 2 in the semiconductor substrate 2. For the impurity to be implanted, it is possible to use an impurity which varies the lattice constant of the crystal composing the semiconductor substrate 2 by implanting the impurity. For example, when the semiconductor substrate 2 comprises a Si-based crystal mainly composed of a Si such as a Si crystal or the like, it is possible to use C, Ge or the like as an impurity. Especially, as C or the like, it is preferable to use an impurity which can suppress the epitaxial crystal growth almost completely if implanted up to a sufficient concentration.

Figure 2A:
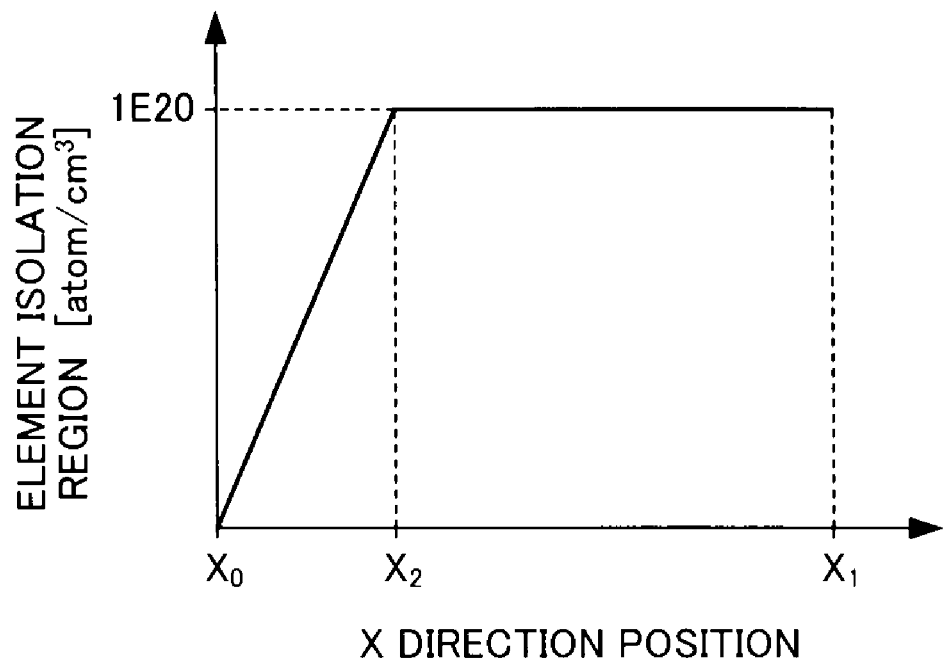
FIGS. 2A and 2B are graphs showing an example of concentration distribution of the conductive impurity in an epitaxial crystal layer of the semiconductor device according to the first embodiment.
Figure 2B:
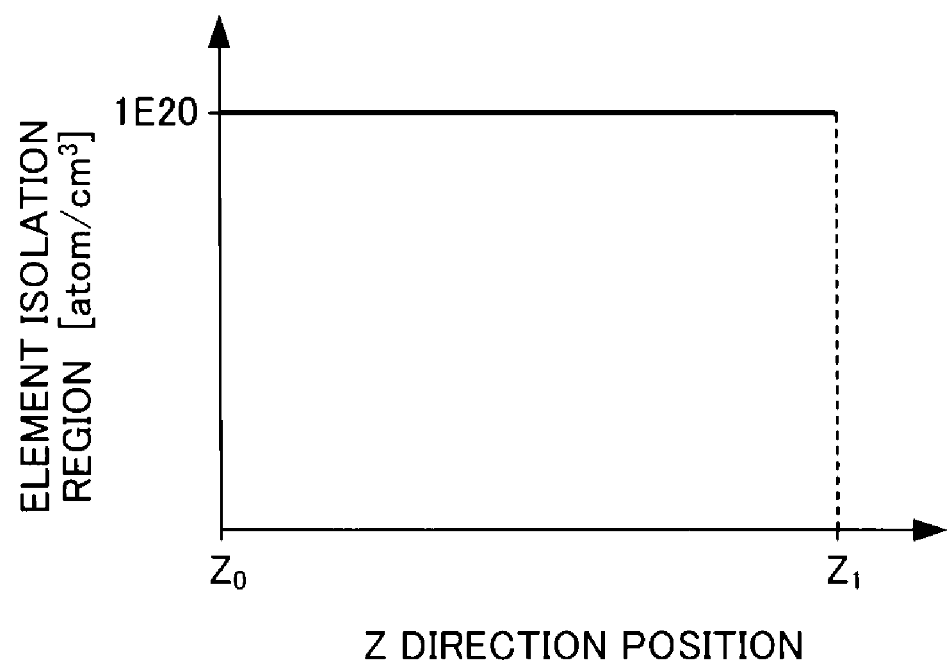

FIGS. 2A and 2B are graphs showing an example of concentration distribution of the conductive impurity in the epitaxial crystal layer 6. FIGS. 2A and 2B are examples of the case that the epitaxial crystal growth does not occur almost completely from the region in which the growth suppressing region 8 of the semiconductor substrate 2 is formed.

A transverse axis in FIG. 2A represents a position of a direction parallel to a channel direction (horizontal direction in FIG. 1, hereinafter referred to as "X direction") and a vertical axis represents a concentration of the conductive impurity. Here, in FIG. 2A, $X_0$ represents a position of an edge portion of the epitaxial crystal layer 6 on the channel region 7 side and $X_1$ represents that on the element isolation region 10 side.

As shown in FIG. 2A, in a region from $X_0$ to a predetermined position $X_2$, the impurity concentration increases corresponding to the distance from $X_0$ and the impurity concentration in a region from $X_2$ to $X_1$ is constant (for example, $1\times10^{20}$ atom/cm$^3$). Note that, the increase of the impurity concentration corresponding to the distance from $X_0$ in the region from $X_0$ to the predetermined position $X_2$ is not limited to be linear as shown in FIG. 2A, for example, it may be a curvilinear increase or a rectangular increase. Furthermore, the implantation of the impurity is not necessarily started from the position $X_0$. In this case, an impurity concentration profile of FIG. 2A starts to rise at a position distant from $X_0$. Furthermore, the position of $X_2$, which is a boundary in which the impurity concentration becomes constant, is not limited to that shown in FIG. 2A. Furthermore, a region in which the impurity concentration is constant, such as a region from $X_2$ to $X_1$, does not necessarily exist. Furthermore, the relation between the X direction position and the impurity concentration becomes like FIG. 2A regardless of a position of a direction vertical to the surface of the semiconductor substrate 2 (a vertical direction in FIG. 1, hereinafter referred to as "Z direction").

A transverse axis in FIG. 2B represents a Z direction position and a vertical axis represents a concentration of the conductive impurity. Here, in FIG. 2B, $Z_0$ represents a position of a bottom surface of the epitaxial crystal layer 6 and $Z_1$ represents a position of an upper edge portion of the epitaxial crystal layer 6.

As shown in FIG. 2B, the impurity concentration is constant (for example, $1\times10^{20}$ atom/$cm^3$) in a region from $Z_0$ to a predetermined position $Z_1$. This is because the epitaxial crystal layer 6 grows only in the X direction and does not grow in the Z direction. Note that, the relation between the Z direction position and the impurity concentration becomes like FIG. 2B regardless of the X direction position.

Note that, when a SiC crystal is used for the epitaxial crystal layer 6 and a growth suppressing region 8 is formed by implanting C, a C concentration in the region with the highest C concentration within the growth suppressing region 8 is higher than the C concentration in the epitaxial crystal layer 6.

Figure 3:
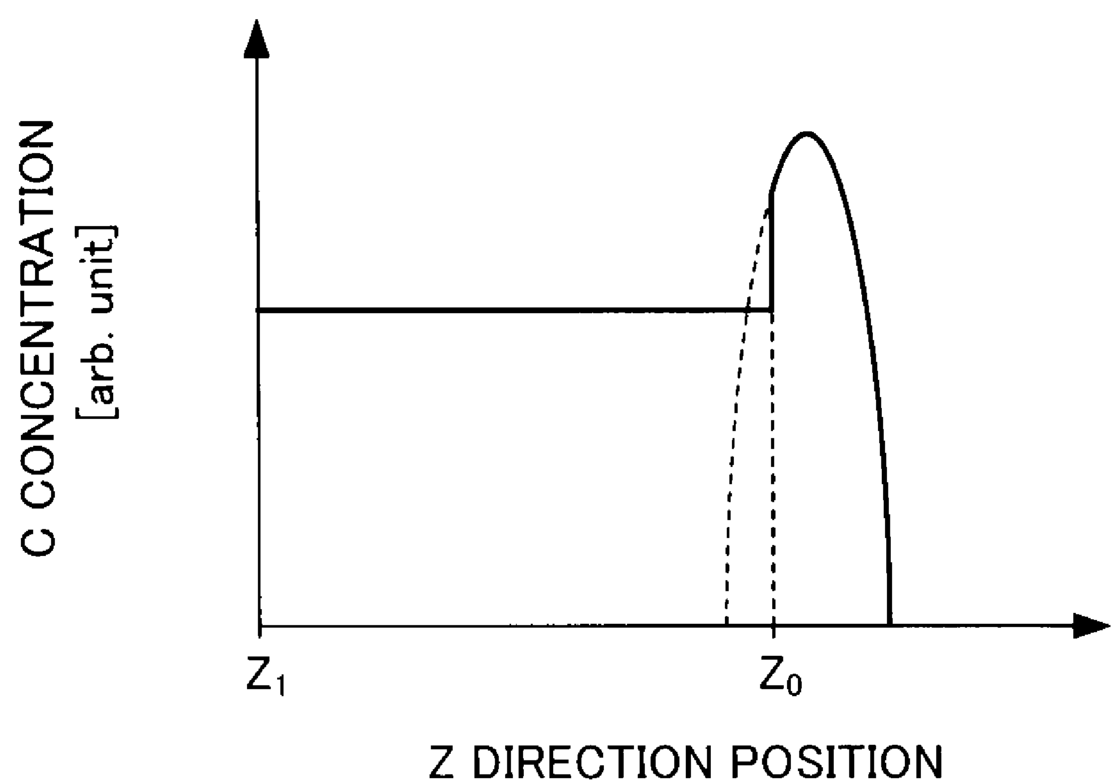
FIG. 3 is a graph showing an example of a relation between a Z direction position and a C concentration of the semiconductor device according to the first embodiment.

FIG. 3 is a graph showing an example of the relation between the Z direction position and the C concentration in this case. A region from $Z_1$ (a position of the upper edge portion of the epitaxial crystal layer 6) to $Z_0$ (a position of the bottom surface of the epitaxial crystal layer 6) is a region in the epitaxial crystal layer 6, and a region to the right of $Z_0$ is a region in the semiconductor substrate 2. A region in the semiconductor substrate 2, in which C exists, corresponds to the growth suppressing region 8.

Similar to the first silicide layer 9*a*, the second silicide layer 9*b* is composed of, for example, a compound of a metal such as Ni, Pt, Co, Er, Y, Yb, Ti, Pd, NiPt, CoNi or the like, with Si.

The element isolation region 10 is composed of, for example, an insulating material such as $SiO_2$ or the like, and has a STI (Shallow Trench Isolation) structure.

An example of a method of fabricating a semiconductor device 1 according to this embodiment will be described hereinafter.

FIGS. 4A to 4H are cross sectional views showing processes for fabricating the semiconductor device according to the first embodiment.

Figure 4A:
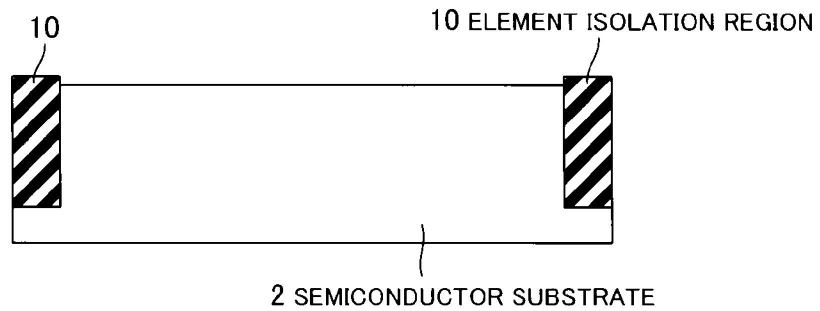
FIGS. 4A to 4H are cross sectional views showing processes for fabricating the semiconductor device according to the first embodiment.

Firstly, as shown in FIG. 4A, the element isolation region 10 is formed in the semiconductor substrate 2 and a conductive impurity is subsequently implanted on the surface of the semiconductor substrate 2 by the ion implanted procedure, which result in that a well (not shown) is formed. Furthermore, the conductive impurity may be implanted in a region which becomes the channel region 7. After that, the implanted conductive impurity is activated by applying heat treatment such as RTA (Rapid Thermal Annealing).

Here, when forming a p-type transistor, an n-type well (not shown) is formed by implanting an n-type impurity ion such as As, P or the like, and then, a p-type impurity ion such as B, $BF_2$ or the like is implanted in the region which becomes the channel region 7. Meanwhile, when forming an n-type transistor, a p-type well (not shown) is formed by implanting a p-type impurity ion, and then, an n-type impurity ion is implanted in the region which becomes the channel region 7.

Figure 4B:
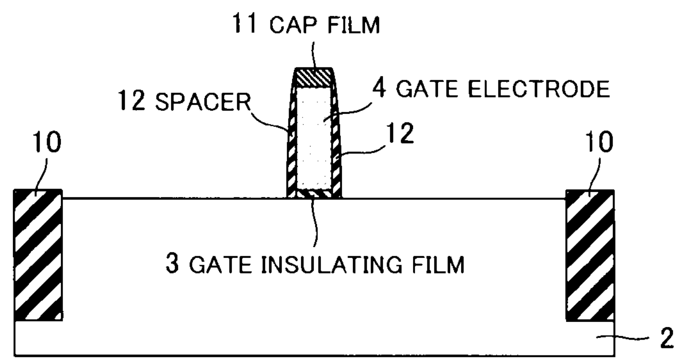

Next, as shown in FIG. 4B, the gate insulating film 3, the gate electrode 4, a cap film 11 and a spacer 12 are formed on the semiconductor substrate 2.

Here, the insulating film 3, the gate electrode 4, the cap film 11 and the spacer 12 are formed by, for example, following method. Firstly, a material film of the insulating film 3 such as a $SiO_2$ film or the like, a material film of the gate electrode 4 such as a polycrystalline silicon film or the like and a material film of the cap film 11 such as SiN etc. are formed by a thermal oxidation method or a LPCVD (Low Pressure Chemical Vapor Deposition) method, respectively. Next, a resist pattern is formed by an optical lithography method, an X-ray lithography method or an electron beam lithography method and the material films of the cap film 11, the gate electrode 4 and the gate insulating film 3 are etched by an RIE (Reactive Ion Etching) method, which result in that the gate insulating film 3, the gate electrode 4 and the cap film 11 are formed. Next, a $SiO_2$ film is formed by the thermal oxidation method so as to cover the gate insulating film 3, the gate electrode 4 and the cap film 11 and a material film of the spacer 12 such as SiN or the like is formed thereon by the LPCVD method. Next, the spacer 12 is formed by etching the material film of the spacer 12 by the RIE method.

Figure 4C:
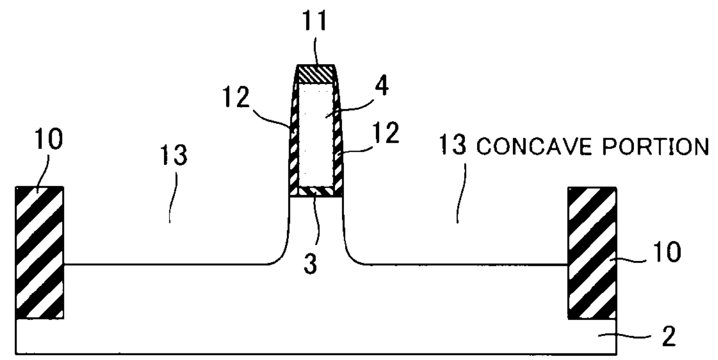

Next, as shown in FIG. 4C, a recess 13 is formed by etching the upper surface of the semiconductor substrate 2 using the spacer 12, the cap film 11 and the element isolation region 10 as a mask. At this time, the etching may be applied only in a vertical direction by anisotropic etching, or, is applied up to a portion of a region below the spacer 12 and the gate insulating film 3 by isotropic etching or the like.

Figure 4D:
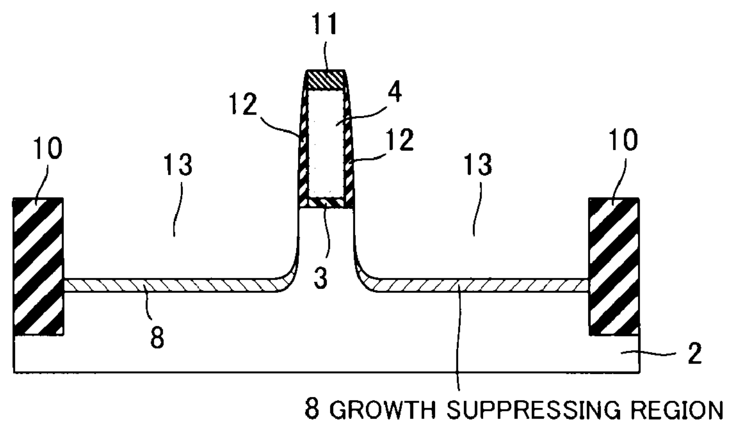

Next, as shown in FIG. 4D, the growth suppressing region 8 is formed by implanting an impurity such as C or the like from a direction vertical to the surface of the semiconductor substrate 2 by the ion implantation procedure. At this time, since the impurity is implanted form the vertical direction, the growth suppressing region 8 is hardly formed in a region located on a side face of the recess 13 of the semiconductor substrate 2. Note that, the growth suppressing region 8 may be formed only in a region not covered by a mask, forming the mask adjacent to the side face of the recess 13 of the semiconductor substrate 2. The growth suppressing region 8 is hardly provided on a surface which faces X axis.

Figure 4E:
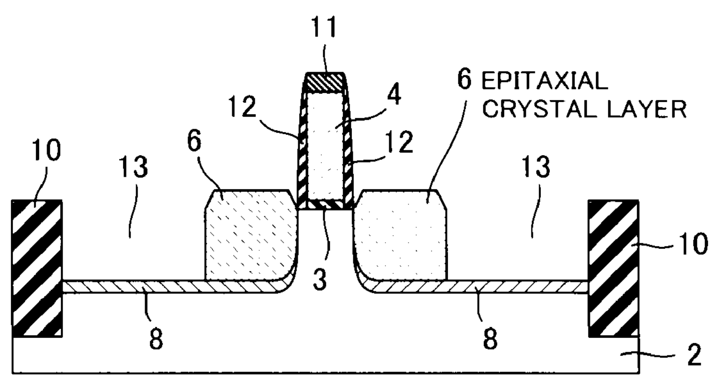

Next, as shown in FIG. 4E, the epitaxial crystal layer 6 which is a crystal containing a conductive impurity is epitaxially grown using a surface of the semiconductor substrate 2 exposed by the recess 13 as a base. At this time, since the growth hardly develops from the region in which the growth suppressing region 8 is formed, the epitaxial crystal layer 6 grows in the X direction mainly from the region located on the side face of the recess 13 of the semiconductor substrate 2.

Figure 4F:
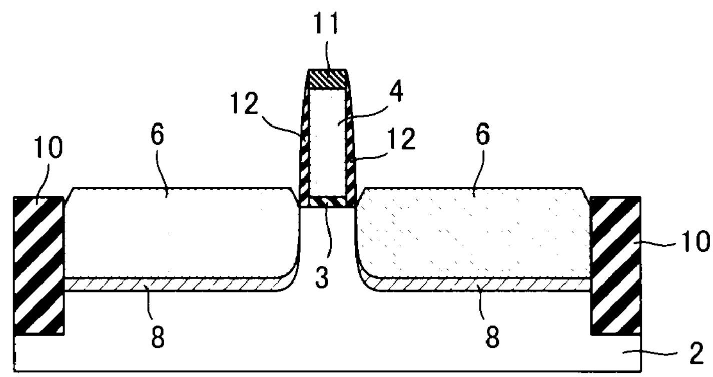

The epitaxial crystal growth is further continued to fill the recess 13 with the epitaxial crystal layer 6 as shown in FIG. 4F. Here, for example, the epitaxial crystal layer 6 is grown by increasing an implantation amount of the conductive impurity per unit time until the crystal to be epitaxially grown reaches to a predetermined position, and then, keeping the implantation amount of conductive impurity per unit time constant so that the distribution of the conductive impurity becomes like the graphs shown in FIGS. 2A and 2B.

Here, when forming a p-type transistor, for example, a p-type epitaxial crystal layer 6 is formed by a vapor phase epitaxially growth of a SiGe crystal containing B under the temperature condition of 700-850° C. using monosilane ($SiH_4$) or dichlorosilane ($SiH_2Cl_2$) as a material of Si, germanium hydride ($GeH_4$) as a material of Ge and diborane ($B_2H_6$) as a material of B in an atmosphere such as hydrogen gas or the like.

On the other hand, when forming an n-type transistor, for example, an n-type epitaxial crystal layer 6 is formed by a vapor phase epitaxially growth of a SiC crystal containing As under the temperature condition of 700-850° C. using monosilane ($SiH_4$) or dichlorosilane ($SiH_2Cl_2$) as a material of Si, acetylene ($C_2H_2$) as a material of C and arsine ($AsH_3$) as a material of As in an atmosphere such as hydrogen gas or the like.

Figure 4G:
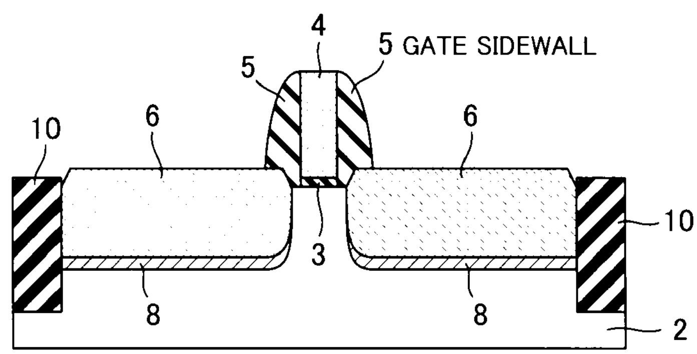

Next, as shown in FIG. 4G, the gate sidewall 5 is formed on the side face of the gate electrode 4 after removing the cap film 11 and the spacer 12 by wet etching using a phosphoric acid or the like.

Here, after depositing a material film of the gate sidewall 5 such as $SiO_2$ or the like so as to cover the side face of the gate electrode 4, the gate sidewall 5 is formed by etching the material film of the gate sidewall 5 by the PIE method.

Figure 4H:
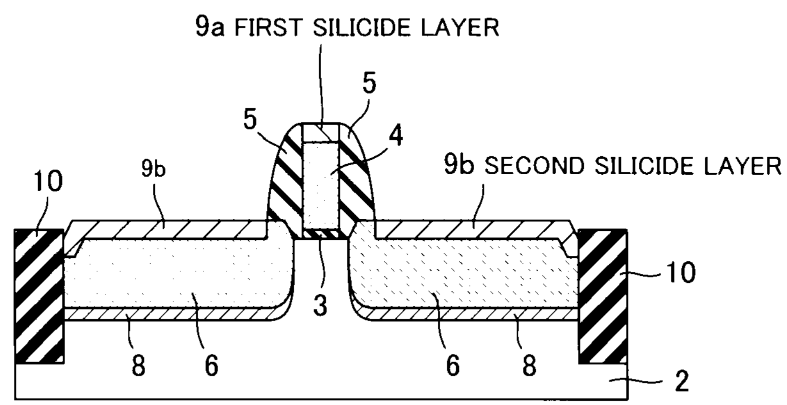

Next, as shown in FIG. 4H, the semiconductor device 1 shown in FIG. 1 is obtained by forming the first silicide layer 9*a* on the upper surface of the gate electrode 4 and the second silicide layer 9*b* on the exposed portion of the upper surface of the epitaxial crystal layer 6.

Here, after removing a natural oxide film by hydrofluoric acid treatment, a metal film (not shown) composed of Ni or the like is deposited by sputtering so as to cover the upper surface of the gate electrode 4 and the exposed portion of the upper surface of the epitaxial crystal layer 6, and then, silicidation reaction is generated on an interface between the metal film and the gate electrode 4 and an interface between the metal film and the epitaxial crystal layer 6 by the RTA at 400-500° C., which results in that the first silicide layer 9*a* and the second silicide layer 9*b* are formed. Furthermore, an unreacted portion of the metal film is removed by etching with a mixed solution of sulfuric acid and hydrogen peroxide solution.

According to the first embodiment, the concentration of the conductive impurity in a region adjacent to the channel region 7 in the epitaxial crystal layer 6 can be lowered than other regions by forming the growth suppressing region 8 and growing the epitaxial crystal layer 6 in the X direction from the channel region 7 side of the semiconductor substrate 2 while increasing the concentration of the conductive impurity which is introduced thereto. As a result, it is possible to generate a strain in a channel region effectively by bringing the epitaxial crystal layer 6 close to the channel region 7 without generating deterioration of a roll-off characteristic.

Furthermore, since the ion implantation procedure is not used for introducing the conductive impurity to the epitaxial crystal layer 6, a damage caused by the ion implantation are not generated in the epitaxial crystal layer 6, and thus, the strain generated in the channel region 7 by the epitaxial crystal layer 6 is not reduced.

Furthermore, it is possible to suppress a diffusion of the conductive impurity in the epitaxial crystal layer 6 into the semiconductor substrate 2 by forming the growth suppressing region 8.

Furthermore, it is possible to equalize the distribution of the impurity concentration in the Z direction in the epitaxial crystal layer 6 by growing the epitaxial crystal layer 6 only in the X direction while implanting the conductive impurity with in-situ impurity doping. As a result, similar to the region adjacent to the surface of the epitaxial crystal layer 6, the high concentration conductive impurity is also implanted to the inside of the epitaxial crystal layer 6, thus, it is possible to reduce parasitic resistance.

Note that, although the epitaxial crystal layer 6 does not grow from the region in which the growth suppressing region 8 is formed but does grow only in the X direction in this embodiment as described above, it may grow in the Z direction from the growth suppressing region 8 as well as in the X direction. In this regard, however, the growth rate in the X direction is preferably larger than that of the Z direction.

Figure 5:
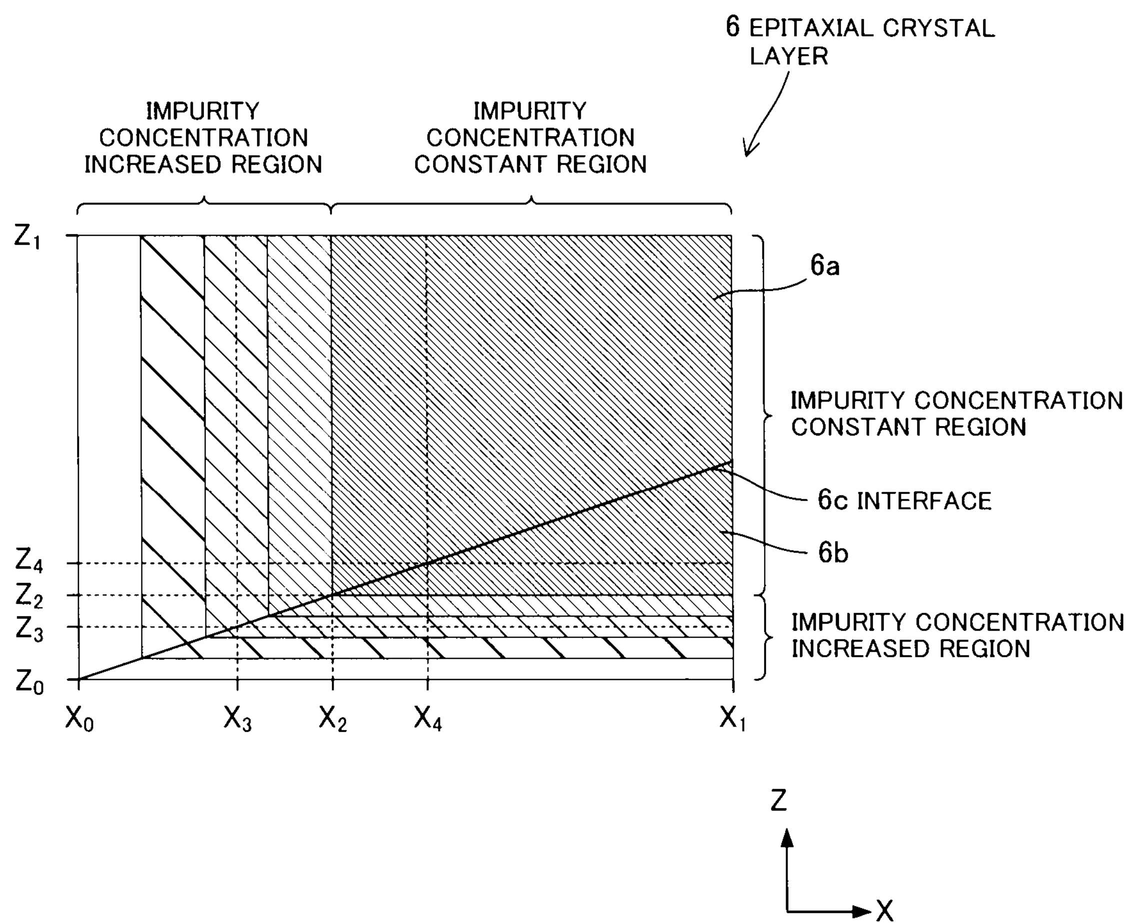
FIG. 5 is a pattern diagram of an epitaxial crystal layer of a variation of the semiconductor device according to the first embodiment.

FIG. 5 is a pattern diagram of the epitaxial crystal layer 6 in case that the epitaxial crystal growth develops from the region in which the growth suppressing region 8 of the semiconductor substrate 2 is formed. In this case, the epitaxial crystal layer 6 comprises an epitaxial crystal layer 6*a* (FIG. 5, upper left) grown in the X direction and an epitaxial crystal layer 6*b* (FIG. 5, lower right) grown in the Z direction. An interface 6*c* is an interface between the epitaxial crystal layers 6*a* and 6*b*, and the inclination thereof is smaller than 45° since the growth rate of the epitaxial crystal layer 6*a* is faster than that of the epitaxial crystal layer 6*b*.

$X_0$ represents a position of an edge portion of the epitaxial crystal layer 6 on the channel region 7 side in the X direction and $X_1$ represents a position of an edge portion of the epitaxial crystal layer 6 on the element isolation region 10 side in the X direction. Furthermore, $Z_0$ represents a position of a bottom surface of the epitaxial crystal layer 6 in the Z direction and $Z_1$ represents a position of an upper edge portion of the epitaxial crystal layer 6 in the Z direction. Furthermore, a region from $X_0$ to $X_2$ of the epitaxial crystal layer 6*a* and a region from $Z_0$ to $Z_2$ of the epitaxial crystal layer 6*b* are regions in which the concentration of the conductive impurity increases corresponding to the distance from $X_0$ or $Z_0$, and a region from $X_2$ to $X_1$ of the epitaxial crystal layer 6*a* and a region from $Z_2$ to $Z_1$ of the epitaxial crystal layer 6*b* are regions in which the concentration of the conductive impurity is constant (for example, $1\times10^{20}$ atom/$cm^3$).

Figure 6A:
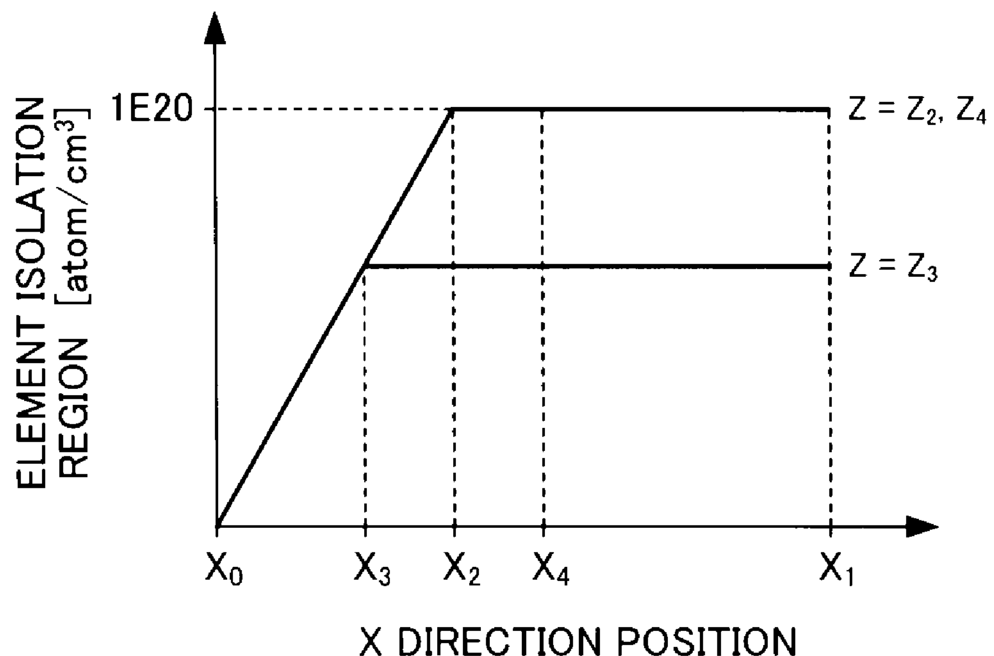
FIGS. 6A and 6B are graphs showing an example of concentration distribution of the conductive impurity in an epitaxial crystal layer of the variation of the semiconductor device according to the first embodiment.
Figure 6B:
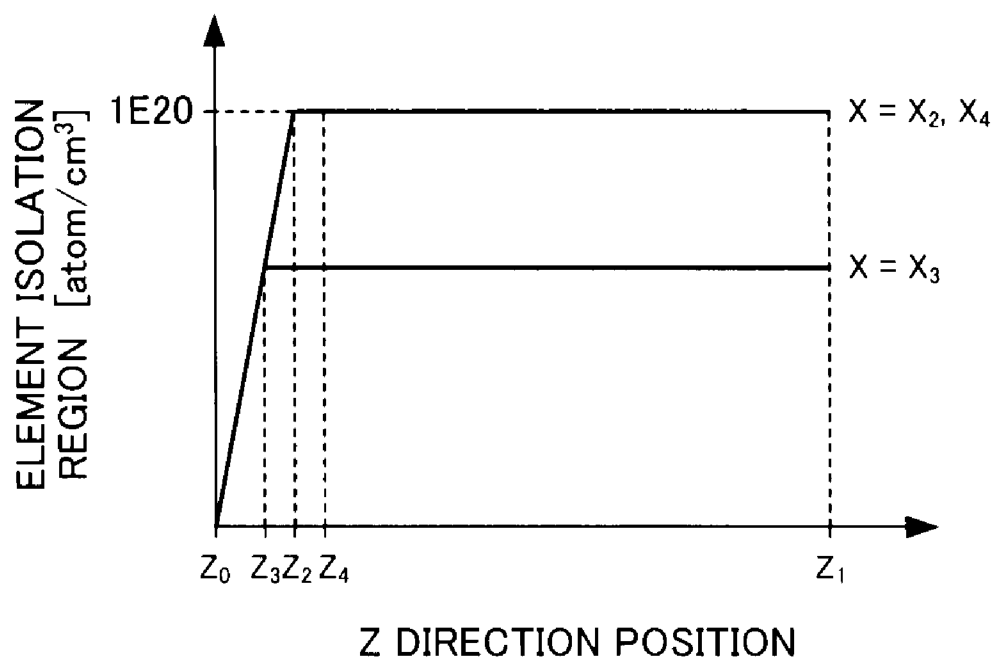

FIGS. 6A and 6B are graphs showing an example of concentration distribution of the conductive impurity in the epitaxial crystal layer 6 shown in FIG. 5.

A transverse axis in FIG. 6A represents an X direction position and a vertical axis represents a concentration of the conductive impurity. FIG. 6A shows a relation between the X direction position and the conductive impurity in respective Z direction positions of $Z=Z_2$, $Z=Z_3$ and $Z=Z_4$ (see FIG. 5).

A transverse axis in FIG. 6B represents a Z direction position and a vertical axis represents a concentration of the conductive impurity. FIG. 6B shows a relation between the Z direction position and the conductive impurity in respective X direction positions of $X=X_2$, $X=X_3$, and $X=X_4$ (see FIG. 5).

As seen from FIG. 5 and FIG. 6A, the relation between the X direction position and the impurity concentration varies depending on the Z direction position in a region of $Z_0 \leqq Z < Z_2$, and becomes constant in a region of $Z_2 \leqq Z < Z_1$. Furthermore, as seen from FIG. 5 and FIG. 6B, the relation between the Z direction position and the impurity concentration varies depending on the X direction position in a region of $X_0 \leqq X < X_2$, and becomes constant in a region of $X_2 \leqq X \leqq X_1$.

However, if the growth rate of the Z direction of the epitaxial crystal layer 6 is retarded by increasing a concentration of an impurity such as C or the like in the growth suppressing region 8 and increasing an effect to suppress the crystal growth, the inclination of the interface 6*c* of FIG. 5 becomes smaller, a profile in a region of $Z_0 < z < Z_2$ including $Z=Z_3$ comes close to that of $Z_2 \leqq z \leqq Z_1$ and the inclination of the profile of $Z_0 \leqq z \leqq Z_2$ of FIG. 6B comes close to 90°. As a result, it is possible to make the profile of FIGS. 6A and 6B close to that of FIGS. 2A and 2B.

Second Embodiment

The second embodiment is different from the first embodiment in that a growth inhibiting film 18 is formed instead of the growth suppressing region 8. Note that, as for a configuration of the other members, the fabrication process or the like which are same as the first embodiment, the explanation will be omitted to simplify.

Figure 7:
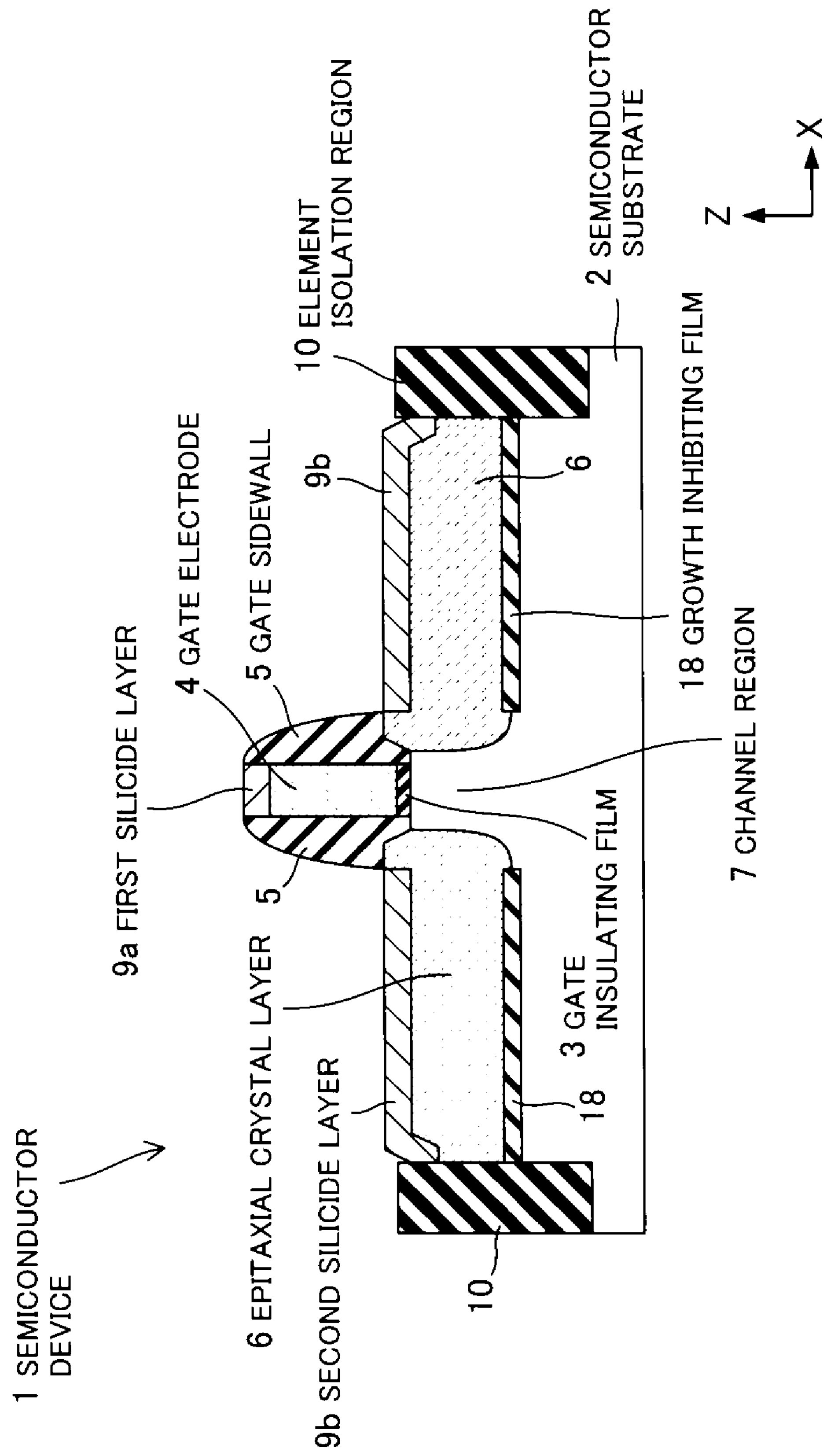
FIG. 7 is a cross sectional view of a semiconductor device according to a second embodiment.

FIG. 7 is a cross sectional view of a semiconductor device according to a second embodiment.

The growth inhibiting film 18 is a film composed of an insulating material such as $SiO_2$, SiN, SiON or the like and has a function to inhibit the epitaxial crystal growth. Note that, the epitaxial crystal layer 6 hardly grows from the region in which the growth inhibiting film 18 is formed, and the concentration distribution of the conductive impurity in the epitaxial crystal layer 6 becomes like FIGS. 2A and 2B.

An example of a method of fabricating a semiconductor device 1 according to this embodiment will be described hereinafter.

Figure 8A:
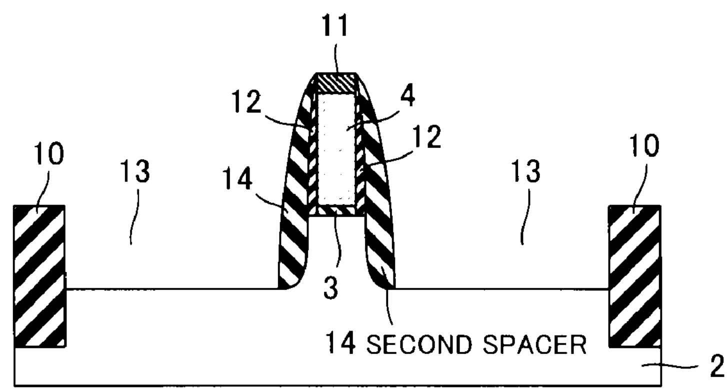
FIGS. 8A to 8C are cross sectional views showing processes for fabricating the semiconductor device according to the second embodiment.
Figure 8B:
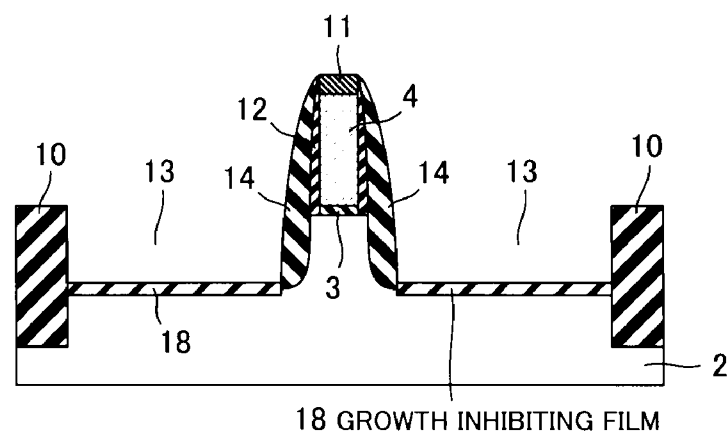
Figure 8C:
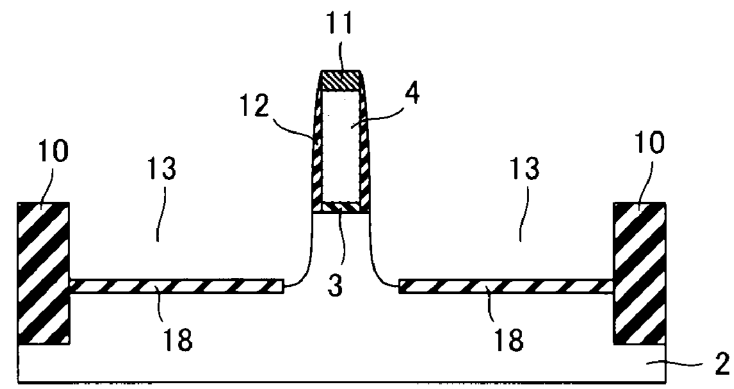

FIGS. 8A to 8C are cross sectional views showing processes for fabricating the semiconductor device according to the second embodiment.

Firstly, the processes until the process, shown in FIGS. 4A to 4C, for forming the recess 13 is carried out in the same way as the first embodiment.

Next, as shown in FIG. 8A, a second spacer 14 is formed so as to cover the spacer 12 and the side face of the recess 13 of the semiconductor substrate 2. For example, after depositing a material film of the second spacer 14 on the semiconductor substrate 2 by the LPCVD method, the second spacer 14 is formed by processing this material film by the RIE method. For the material of the second spacer 14, an insulating material, which can have large etching selectivity with an insulating material used for the growth inhibiting film 18, such as $SiO_2$, SiN or the like is used.

Next, as shown in FIG. 8B, the growth inhibiting film 18 is formed on a region of the bottom surface of the recess 13 of the semiconductor substrate 2, which is not covered by the second spacer 14. For example, when using a $SiO_2$ film as the growth inhibiting film 18, it is possible to form the growth inhibiting film 18 by a method to apply oxidation treatment to the surface of the semiconductor substrate 2, the CVD method or the like. Furthermore, when using a SiN film as the growth inhibiting film 18, it is possible to form the growth inhibiting film 18 by a method to apply nitriding treatment to the surface of the semiconductor substrate 2, the CVD method or the like. Furthermore, when using a SiON film as the growth inhibiting film 18, it is possible to form the growth inhibiting film 18 by a method to apply oxynitriding treatment to the surface of the semiconductor substrate 2, the CVD method or the like.

The growth inhibiting film 18 is provided on the bottom surface of the recess 13 in FIG. 8B. However, the growth inhibiting film 18 may be provided on a corner of the recess 13 as a part of inner surface of recess 13 near the gate electrode 4 when the amount of the second spacer 14 is small in transverse direction.

Next, as shown in FIG. 8C, the second spacer 14 is removed, for example, by wet etching using a hydrochloric acid, a phosphoric acid or the like as an etchant.

After that, a process following the process for growing the epitaxial crystal layer 6 shown in FIG. 4E is carried out in the same way as the first embodiment.

According to the second embodiment, it is possible to obtain an effect similar to the first embodiment by forming the growth inhibiting film 18 instead of the growth suppressing region 8 according to the first embodiment.

Furthermore, since the growth inhibiting film 18 according to this embodiment comprises an insulating film, the difference in the effect to inhibit the growth of the epitaxial crystal layer 6 due to the manufacturing condition is less likely to occur. Namely, unlike the first embodiment, the difference in the effect does not occur due to the concentration of the impurity to be implanted and it is possible to inhibit the growth of the epitaxial crystal layer 6 almost completely regardless of the manufacturing condition.

In the same way, it is possible to effectively prevent the diffusion of the conductive impurity in the epitaxial crystal layer 6 into the semiconductor substrate 2 regardless of the manufacturing condition.

Furthermore, since a p-n junction is not formed under the epitaxial crystal layer 6, it is possible to reduce junction capacitance.

Third Embodiment

The third embodiment is different from the first embodiment in a shape of the epitaxial crystal layer 6. Note that, as for a configuration of the other members, the fabrication process or the like which are same as the first embodiment, the explanation will be omitted to simplify.

Figure 9:
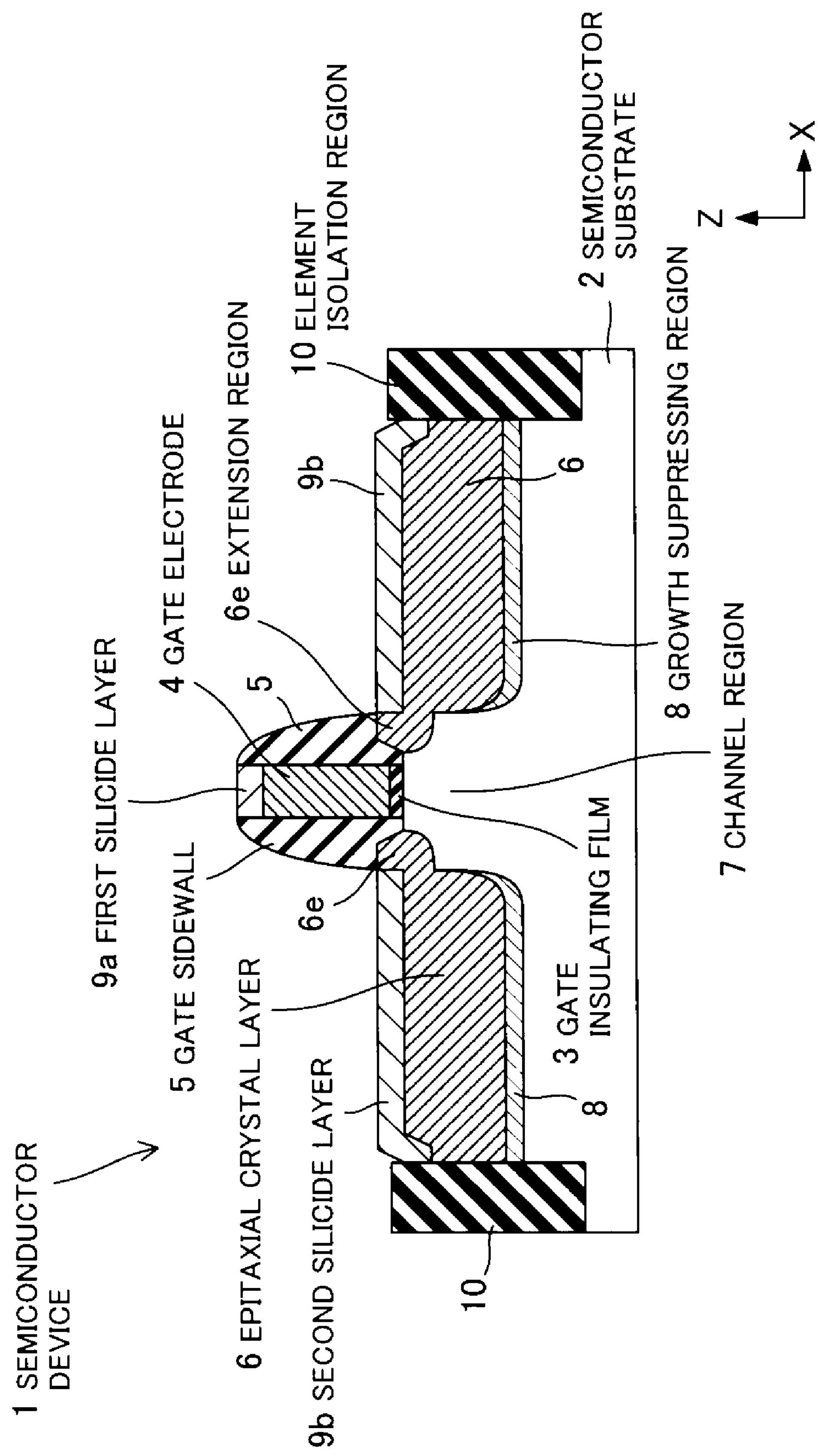
FIG. 9 is a cross sectional view of a semiconductor device according to a third embodiment.

FIG. 9 is a cross sectional view of a semiconductor device according to a third embodiment.

The epitaxial crystal layer 6 has a shallow extension region 6*e* in a region of the channel region 7 side. Note that, the concentration distribution of the conductive impurity in the epitaxial crystal layer 6 becomes like FIGS. 2A and 2B or FIGS. 6A and 6B due to the effect to suppress the growth of the epitaxial crystal layer 6 of the growth suppressing region 8.

An example of a method of fabricating the semiconductor device 1 according to this embodiment will be described hereinafter.

FIGS. 10A to 10H are cross sectional views showing processes for fabricating the semiconductor device according to the third embodiment.

Figure 10A:
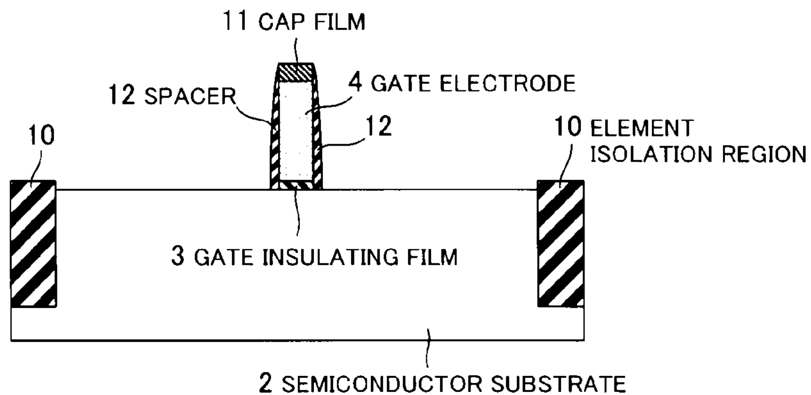
FIGS. 10A to 10H are cross sectional views showing processes for fabricating the semiconductor device according to the third embodiment.

Firstly, as shown in FIG. 10A, the processes until the process, shown in FIGS. 4A and 4B, for forming the spacer 12 is carried out in the same way as the first embodiment.

Figure 10B:
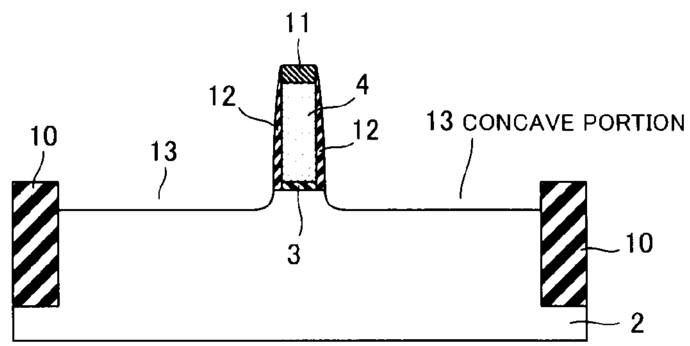

Next, as shown in FIG. 10B, the recess 13 is formed by etching up to the same depth as the extension region 6*e* of the epitaxial crystal layer 6 in which the upper surface of the semiconductor substrate 2 will be formed later, using the spacer 12, the cap film 11 and the element isolation region 10 as a mask.

Figure 10C:
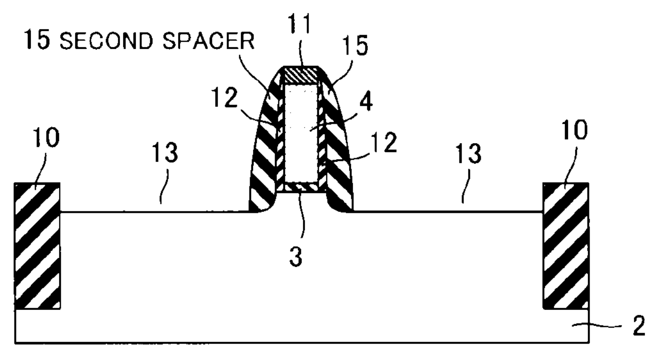

Next, as shown in FIG. 10C, a second spacer 15 is formed so as to cover the spacer 12 and the side face of the recess 13 of the semiconductor substrate 2. For example, after depositing a material film of the second spacer 15 on the semiconductor substrate 2 by the LPCVD method, the second spacer 15 is formed by processing this material film by the RIE method. For the material of the second spacer 15, it is possible to use an insulating material such as $SiO_2$, SiN or the like.

Figure 10D:
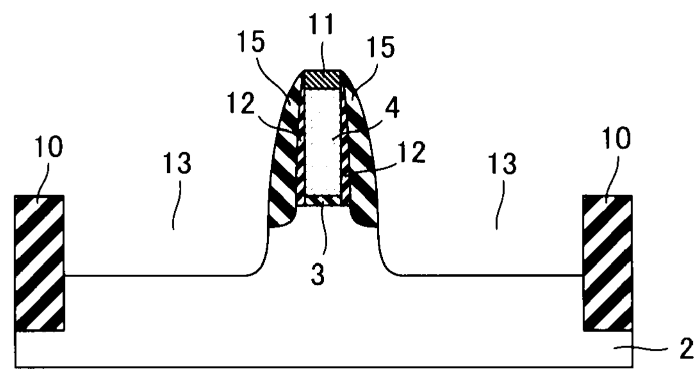

Next, as shown in FIG. 10D, the upper surface of the semiconductor substrate 2 is etched using the second spacer 15, the cap film 11 and the element isolation region 10 as a mask. And, the bottom of the region not covered by the second spacer 15 of the recess 13 is dug down up to the depth of the epitaxial crystal layer 6.

Figure 10E:
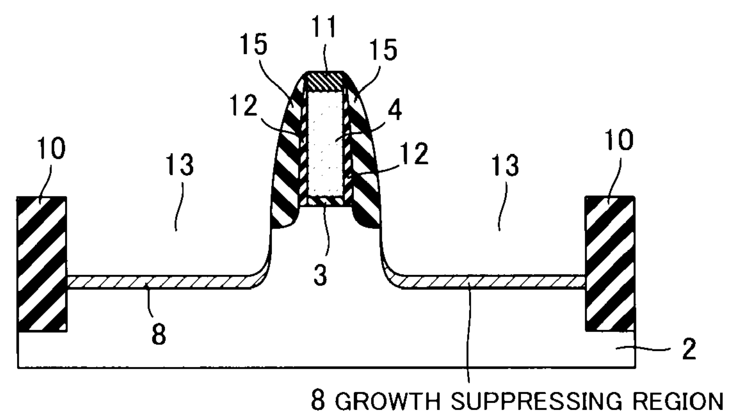

Next, as shown in FIG. 10E, the growth inhibiting film 18 is formed by implanting an impurity such as C or the like from a direction vertical to the surface of the semiconductor substrate 2 by the ion implantation procedure. At this time, since the impurity is implanted form the vertical direction, the growth inhibiting film 18 is hardly formed in a region located on the side face of the recess 13 of the semiconductor substrate 2.

Figure 10F:
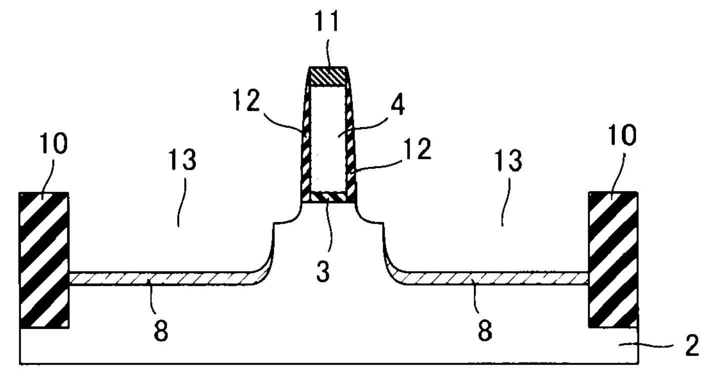

Next, as shown in FIG. 10F, the second spacer 15 is removed by wet etching or the like. Note that, the growth inhibiting film 18 may be formed by implanting the impurity such as C or the like after removing the second spacer 15.

Figure 10G:
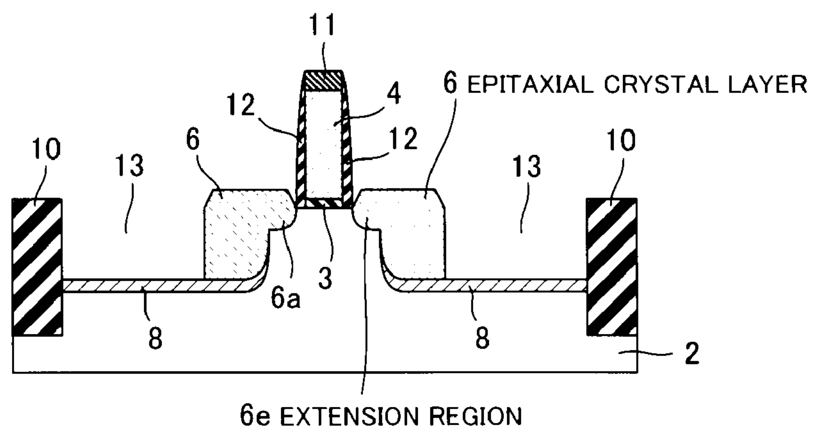

Next, as shown in FIG. 10G, the epitaxial crystal layer 6 which is a crystal containing a conductive impurity is epitaxially grown using the surface of the semiconductor substrate 2 exposed by the recess 13 as a base. At this time, since the growth hardly develops in the region in which the growth suppressing region 8 is formed, the epitaxial crystal layer 6 grows in the X direction mainly from the region located on the side face of the recess 13 of the semiconductor substrate 2. Here, in formed the epitaxial crystal layer 6, a portion which grows in a shallow region of the recess 13 becomes the extension region 6*e*.

Figure 10H:
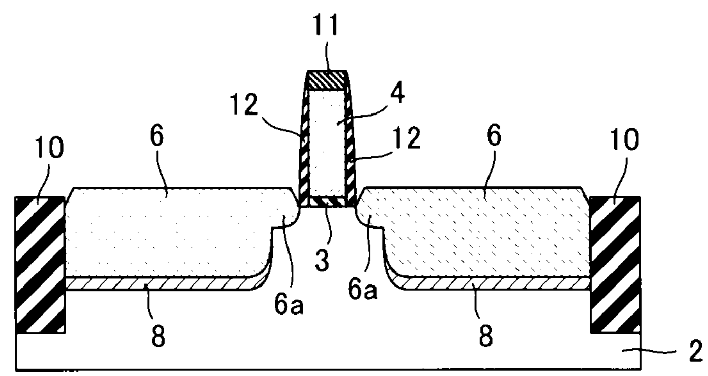

The epitaxial crystal growth is further continued to fill the recess 13 with the epitaxial crystal layer 6 as shown in FIG. 10H. Here, for example, the epitaxial crystal layer 6 is grown by increasing an implantation amount of the conductive impurity per unit time until the crystal to be epitaxially grown reaches to a predetermined position, and then, keeping the implantation amount of conductive impurity per unit time constant so that the distribution of the conductive impurity becomes like the graphs shown in FIGS. 2A and 2B.

After that, a process following the formation process of the gate sidewall 5 shown in FIG. 4G is carried out in the same way as the first embodiment.

According to the third embodiment, it is possible to reduce deterioration of a roll-off characteristic more effectively by providing the extension region 6*e* in the epitaxial crystal layer 6.

Fourth Embodiment

The fourth embodiment is different from the first embodiment in the shape of the epitaxial crystal layer 6 and the growth suppressing region 8. Note that, as for a configuration of the other members, the fabrication process or the like which are same as the first embodiment, the explanation will be omitted to simplify.

Figure 11:
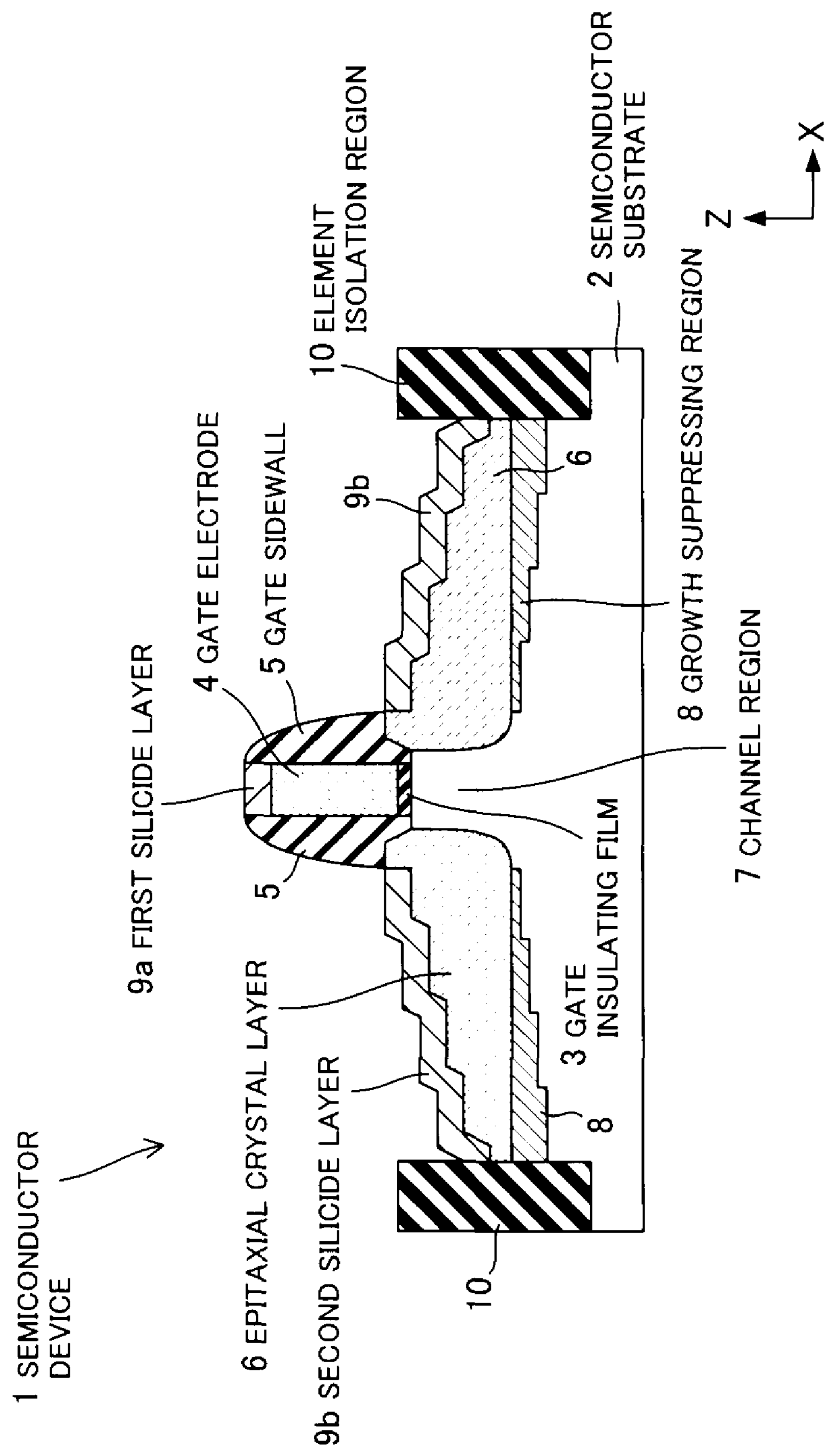
FIG. 11 is a cross sectional view of a semiconductor device according to a fourth embodiment.

FIG. 11 is a cross sectional view of a semiconductor device according to a fourth embodiment.

The epitaxial crystal layer 6 has a step-like shape in which the height is lowered in tiers from the channel region 7 side toward the element isolation region 10 side. Note that, the number and the difference in level of steps are not limited to the number shown in FIG. 11. Furthermore, the shape of the first silicide layer 9*a* is also a step-like shape in accordance with the shape of the epitaxial crystal layer 6.

In the growth suppressing region 8, the impurity concentration of C or the like is increasing from the channel region 7 side toward the element isolation region 10 side corresponding to the position of each step of the step-like shape of the epitaxial crystal layer 6.

An example of a method of fabricating the semiconductor device 1 according to this embodiment will be described hereinafter.

FIGS. 12A to 12I are cross sectional views showing processes for fabricating the semiconductor device according to the fourth embodiment.

Firstly, the processes until the process, shown in FIGS. 4A to 4C, for forming the recess 13 is carried out in the same way as the first embodiment.

Figure 12A:
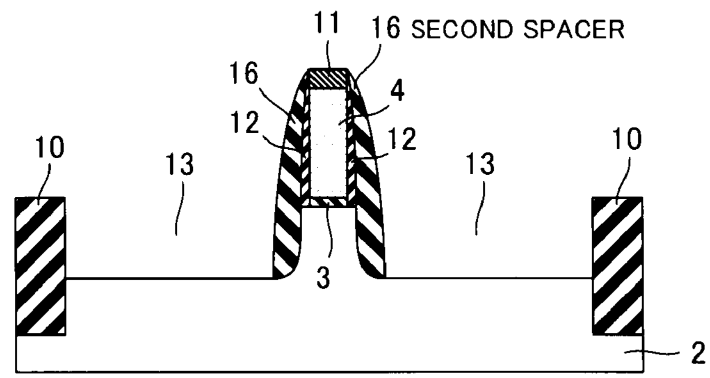
FIGS. 12A to 12I are cross sectional views showing processes for fabricating the semiconductor device according to the fourth embodiment.

Next, as shown in FIG. 12A, a second spacer 16 is formed so as to cover the spacer 12 and the side face of the recess 13 of the semiconductor substrate 2. For example, after depositing a material film of the second spacer 16 on the semiconductor substrate 2 by the LPCVD method, the second spacer 16 is formed by processing this material film by the RIE method. For the material of the second spacer 16, it is possible to use an insulating material such as $SiO_2$, SiN or the like.

Figure 12B:
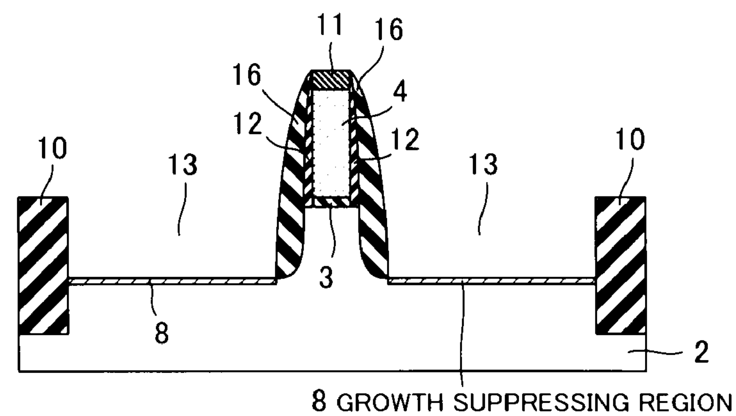

Next, as shown in FIG. 12B, the growth suppressing region 8 is formed by implanting an impurity such as C or the like to the surface of the semiconductor substrate 2 by the ion implantation procedure using the second spacer 16, the cap film 11 and the element isolation region 10 as a mask.

Figure 12C:
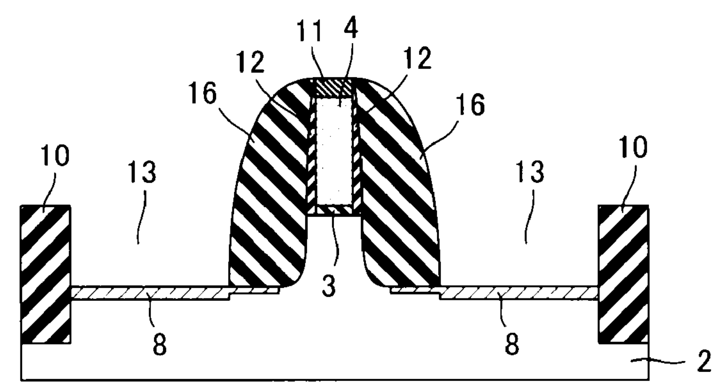

Next, as shown in FIG. 12C, after increasing the thickness of the second spacer 16, the concentration of an impurity in the region not covered by the second spacer 16 of the growth suppressing region 8 is increased by implanting the impurity such as C or the like to the surface of the semiconductor substrate 2 by the ion implantation procedure using the thickened second spacer 16, the cap film 11 and the element isolation region 10 as a mask. Here, for example, after depositing a material film of the second spacer 16 on the second spacer 16 by the LPCVD method, the second spacer 16 is thickened by processing this material film by the RIE method.

Figure 12D:
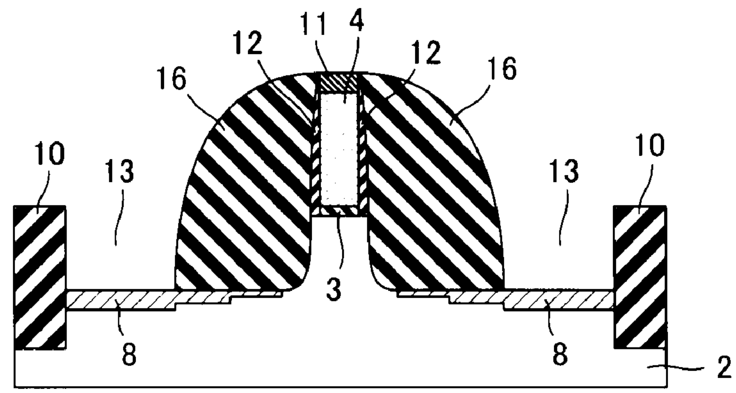
Figure 12E:
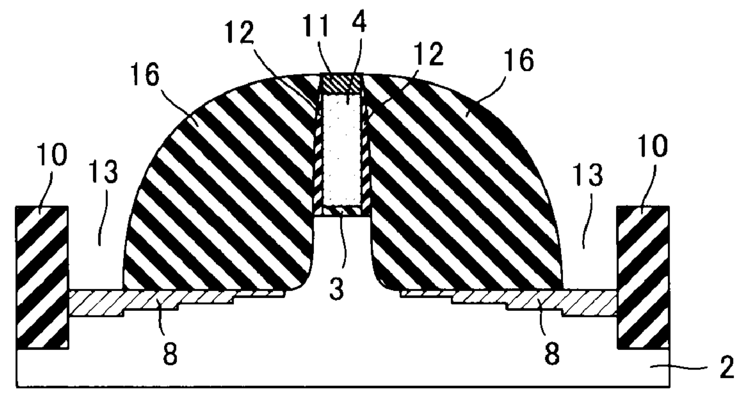

Next, as shown in FIGS. 12D and 12E, in the same way as the process shown in FIG. 12C, after increasing the thickness of the second spacer 16, the process to increase the concentration of the growth suppressing region 8 in the region not covered by the second spacer 16 by implanting an impurity such as C or the like to the surface of the semiconductor substrate 2 is repeated. As a result, the concentration of the impurity contained in the growth suppressing region 8 is gradually increasing form the channel region 7 side toward the element isolation region 10 side. Note that, FIG. 12B shows that the depth of the growth suppressing region 8 is increasing form the channel region 7 side toward the element isolation region 10 side, however, the depth is not necessarily increased in fact as long as the impurity concentration is increased.

Figure 12F:
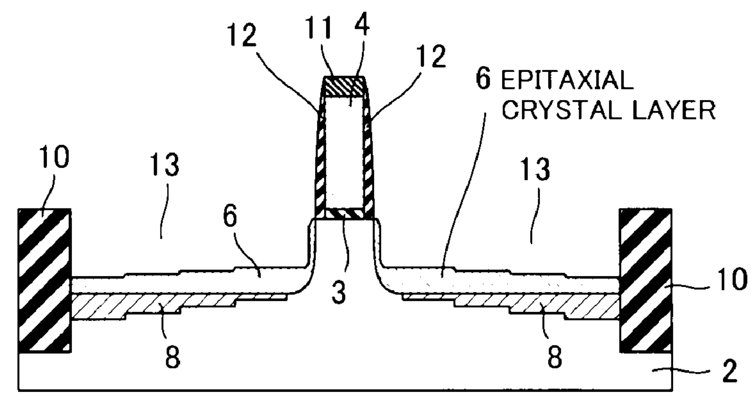

Next, as shown in FIG. 12F, the epitaxial crystal layer 6 which is a crystal containing a conductive impurity is epitaxially grown using a surface of the semiconductor substrate 2 exposed by the recess 13 as a base. At this time, since the concentration of the impurity contained in the growth suppressing region 8 is gradually increasing from the channel region 7 side toward the element isolation region 10 side, the growth rate of the epitaxial crystal layer 6 from the bottom portion of the recess 13 is faster when closer to the channel region 7, and is slower when closer to the element isolation region 10.

Figure 12G:
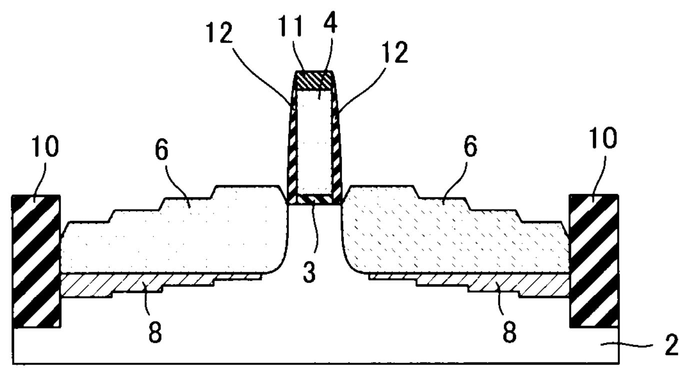

As shown in FIG. 12G, if the epitaxial crystal growth is further continued, the epitaxial crystal layer 6 having a step-like shape, in which the height in the step-like shape is lowered in tiers from the channel region 7 side toward the element isolation region 10 side, is formed.

Figure 12H:
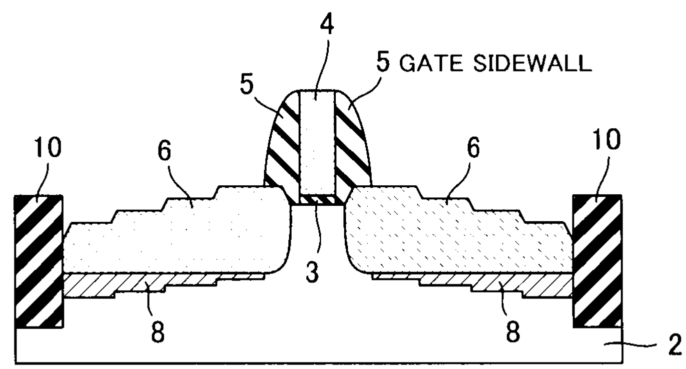

Next, as shown in FIG. 12H, the gate sidewall 5 is formed on the side face of the gate electrode 4 after removing the second spacer 16, the cap film 11 and the spacer 12 by wet etching or the like.

Figure 12I:
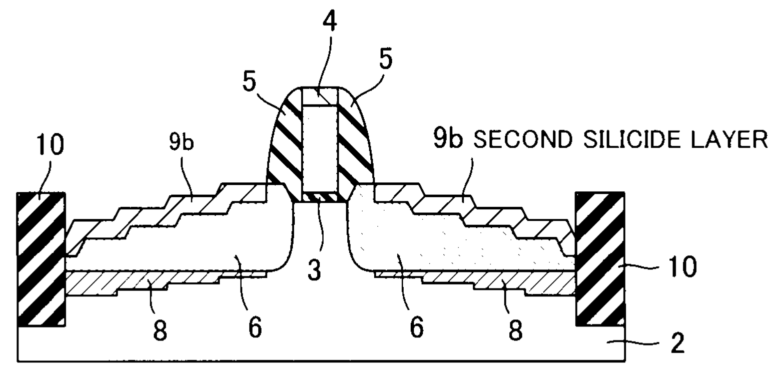

Next, as shown in FIG. 12I, the semiconductor device 1 shown in FIG. 11 is obtained by forming the first silicide layer 9*a* on the upper surface of the gate electrode 4 and the second silicide layer 9*b* in an exposed portion on the upper surface of the epitaxial crystal layer 6.

According to the fourth embodiment, it is possible to make the epitaxial crystal layer 6 in a step-like shape by giving distribution to the impurity concentration of the growth suppressing region 8, in which the concentration of the impurity increases from the channel region 7 side toward the element isolation region 10 side. It is possible to vary the number and the difference in level of steps in the step-like shape of the epitaxial crystal layer 6 by adjusting the distribution of the impurity concentration in the growth suppressing region 8, as a result, it is possible to vary the level of the strain generated in the channel region 7 by the epitaxial crystal layer 6.

Other Embodiments

It should be noted that the embodiment is not intended to be limited to the above-mentioned first to fourth embodiments, and the various kinds of changes thereof can be implemented by those skilled in the art without departing from the gist of the invention.

The growth suppressing region 8 may be provided on not only the bottom surface of the recess 13 but a corner of the recess 13.

In another aspect, the growth suppressing region 8 is preferably provided on the bottom of the recess 13, and not provided on the corner of the recess 13 so as to suppress a growth of a crystal toward other than X axis.

In addition, the constituent elements of the above-mentioned embodiments can be arbitrarily combined with each other without departing from the gist of the invention.

What is claimed is:

1. A semiconductor device, comprising:

a semiconductor substrate;

a gate electrode formed on the semiconductor substrate via a gate insulating film;

a channel region formed in a region of the semiconductor substrate below the gate electrode;

an epitaxial crystal layer containing a conductive impurity, which is formed sandwiching the channel region and has a function as a source region and a drain region, and formed on a recess in the semiconductor substrate, each of the source and drain regions including first and second regions divided by a boundary plane perpendicular to a channel direction; and a growth suppressing portion formed on the recess in the semiconductor substrate, and configured to suppress an epitaxial growth of a crystal in the epitaxial layer from the semiconductor substrate;

wherein the first region is located on a channel region side, and has a conductive impurity concentration continuously increasing with a distance from the channel region in the channel direction;

the second region has a conductive impurity concentration which is constant in the channel direction;

the conductive impurity concentration in the first region and the conductive purity concentration in the second region are equal at the boundary plane;

conductive impurity concentrations in the source and drain regions are lowest at a first edge of the first region on the channel region side, and highest at a second edge of the second region on an opposing side of the channel region side;

the epitaxial crystal layer is formed on the recess via the growth suppressing portion so as to epitaxially grow only in the channel direction from the first edge of the first region; and the epitaxial crystal layer is formed to epitaxially grow so that the conductive impurity concentration in the first region continuously increases with the distance from the channel region in the channel direction, and the conductive impurity concentration in the second region is constant in the channel direction.

2. The semiconductor device according to claim 1, wherein the growth suppressing portion is formed by implanting an impurity to a surface of the recess in the semiconductor substrate.

3. The semiconductor device according to claim 1, wherein the growth suppressing portion is an insulating film formed on the recess in the semiconductor substrate.

4. The semiconductor device according to claim 1, wherein the concentration of the conductive impurity of the epitaxial crystal layer is the lowest among the regions adjacent to the channel region.

5. The semiconductor device according to claim 1, wherein the epitaxial crystal layer includes an extension region adjacent to the channel region, the extension region having a depth shallower than other regions in the epitaxial crystal layer.

6. The semiconductor device according to claim 1, wherein the epitaxial crystal layer includes a crystal having a lattice constant different from that of the crystal of the semiconductor substrate.

7. The semiconductor device according to claim 6, wherein the epitaxial crystal layer contains a SiGe crystal or a SiC crystal.

8. The semiconductor device according to claim 2, wherein the semiconductor substrate comprises a Si-based crystal; and the impurity contains at least one of C and Ge.

9. The semiconductor device according to claim 8, wherein the epitaxial crystal layer contains a SiC crystal;

the impurity is C; and the growth suppressing portion includes a region of which C concentration is higher than that in the epitaxial crystal layer.

10. The semiconductor device according to claim 3, wherein the insulating film contains at least one of $SiO_2$, SiN and SiON.

11. The semiconductor device according to claim 2, wherein the growth suppressing portion has a plurality of regions having different impurity concentrations; and the epitaxial crystal layer has a plurality of regions having upper surfaces with different height which corresponds to the position of the plurality of regions having the different impurity concentrations of the growth suppressing portion.

12. The semiconductor device according to claim 11, wherein an impurity concentration in the plurality of regions in the growth suppressing portion increases corresponding to an increase in the distance from the channel region; and a height of the upper surface in the plurality of regions of the epitaxial crystal layer decreases corresponding to an increase in the distance from the channel region.

13. A semiconductor device, comprising:

a semiconductor substrate;

a gate electrode formed on the semiconductor substrate via a gate insulating film;

a channel region formed in a region of the semiconductor substrate below the gate electrode;

an epitaxial crystal layer containing a conductive impurity, which is formed sandwiching the channel region and has a function as a source region and a drain region, and formed on a recess in the semiconductor substrate; and a growth suppressing portion formed on the recess in the semiconductor substrate by implanting an impurity to a surface of the recess in the semiconductor substrate, and configured to suppress an epitaxial growth of a crystal in the epitaxial layer from the semiconductor substrate;

wherein the growth suppressing portion has a plurality of regions having different impurity concentrations; and the epitaxial crystal layer has a plurality of regions having upper surfaces with different height which corresponds to the position of the plurality of regions having the different impurity concentrations of the growth suppressing portion.

14. The semiconductor device according to claim 13, wherein an impurity concentration in the plurality of regions in the growth suppressing portion increases corresponding to an increase in the distance from the channel region; and a height of the upper surface in the plurality of regions of the epitaxial crystal layer decreases corresponding to an increase in the distance from the channel region.

* * * * *